(12) United States Patent
Holland

(10) Patent No.: US 12,261,242 B2  
(45) Date of Patent: Mar. 25, 2025

(54) SEMICONDUCTOR CHIP AND METHOD FOR PRODUCING A SEMICONDUCTOR CHIP

(71) Applicant: OSRAM Opto Semiconductors GmbH, Regensburg (DE)

(72) Inventor: Brendan Holland, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 545 days.

(21) Appl. No.: 17/638,660

(22) PCT Filed: Jul. 27, 2020

(86) PCT No.: PCT/EP2020/071109  
§ 371 (c)(1),  
(2) Date: Feb. 25, 2022

(87) PCT Pub. No.: WO2021/037457  
PCT Pub. Date: Mar. 4, 2021

(65) Prior Publication Data  
US 2022/0336701 A1   Oct. 20, 2022

(30) Foreign Application Priority Data  
Aug. 27, 2019   (DE) .................. 102019122945.6

(51) Int. Cl.  
*H01L 33/20*   (2010.01)  
*H01L 33/00*   (2010.01)  
*H01L 33/10*   (2010.01)  
*H01L 33/62*   (2010.01)

(52) U.S. Cl.  
CPC ............ *H01L 33/20* (2013.01); *H01L 33/005* (2013.01); *H01L 33/10* (2013.01); *H01L 33/62* (2013.01)

(58) Field of Classification Search  
CPC ....... H01L 33/20; H01L 33/005; H01L 33/10; H01L 33/62; H01L 33/42; H01L 33/025; H01L 33/06; H01L 33/24; H01L 2933/0016  
See application file for complete search history.

(56) References Cited

U.S. PATENT DOCUMENTS

| | | |
|---|---|---|
| 10,186,636 B2 | 1/2019 | Desieres |
| 10,862,003 B2 | 12/2020 | Lehnhardt et al. |
| 10,950,752 B2 | 3/2021 | Bergbauer et al. |
| 2009/0294785 A1* | 12/2009 | Cok .............. H10K 50/85 257/E33.001 |

(Continued)

FOREIGN PATENT DOCUMENTS

| | | |
|---|---|---|
| EP | 3113235 A1 | 1/2017 |
| WO | 2014175837 A1 | 10/2014 |

(Continued)

*Primary Examiner* — Samuel Park  
(74) *Attorney, Agent, or Firm* — Slater Matsil, LLP

(57) ABSTRACT

In an embodiment a semiconductor chip includes a semiconductor body having a first region, a second region, and an active region between the first region and the second region, indentations in the first region, a TCO material in the indentations and a carrier, wherein the indentations of the first region are arranged on a side of the first region facing away from the carrier, and wherein the TCO material is flush with a surface of the first region facing away from the active region.

13 Claims, 3 Drawing Sheets

(56) References Cited

U.S. PATENT DOCUMENTS

| | | |
|---|---|---|
| 2010/0052000 A1 | 3/2010 | Ko et al. |
| 2012/0032137 A1 | 2/2012 | Schellhammer |
| 2012/0280263 A1 | 11/2012 | Ibbetson et al. |
| 2013/0037779 A1 | 2/2013 | Takeoka et al. |
| 2017/0005230 A1 | 1/2017 | Desieres |
| 2019/0164945 A1 * | 5/2019 | Chae ........................ H01L 25/13 |

FOREIGN PATENT DOCUMENTS

| | | | |
|---|---|---|---|
| WO | 2017144512 A1 | 8/2017 | |
| WO | WO-2017198776 A1 * | 11/2017 | ........... H01L 33/007 |

* cited by examiner

SEMICONDUCTOR CHIP AND METHOD FOR PRODUCING A SEMICONDUCTOR CHIP

This patent application is a national phase filing under section 371 of PCT/EP2020/071109, filed Jul. 27, 2020, which claims the priority of German patent application 102019122945.6, filed Aug. 27, 2019, each of which is incorporated herein by reference in its entirety.

TECHNICAL FIELD

International Application Publication WO 2017/144512A1 describes a semiconductor chip and a method for producing such a semiconductor chip.

SUMMARY OF THE INVENTION

Embodiments provide a semiconductor chip having improved electrical and/or optical properties. Further embodiments provide a method for producing such a semiconductor chip.

A semiconductor chip is described. The semiconductor chip is, for example, an electronic semiconductor chip or, in particular, an optoelectronic semiconductor chip. The semiconductor chip may comprise, for example, a diode and/or a transistor. In particular, it is possible for the semiconductor chip to be an optoelectronic semiconductor chip configured to generate radiation and comprising, for example, a light-emitting diode or forming a light-emitting diode.

According to at least one embodiment of the semiconductor chip, the semiconductor chip comprises a semiconductor body having a first region, a second region, and an active region between the first region and the second region.

For example, the semiconductor body is based on a III-V compound semiconductor material, in particular a nitride compound semiconductor material.

A III-V compound semiconductor material has at least one element from the third main group, such as B, Al, Ga, In, and one element from the fifth main group, such as N, P, As. In particular, the term "III-V compound semiconductor material" includes the group of binary, ternary or quaternary compounds comprising at least one element from the third main group and at least one element from the fifth main group, for example nitride and phosphide compound semiconductors. Such a binary, ternary or quaternary compound may further comprise, for example, one or more dopants as well as additional constituents.

Based on "nitride compound semiconductor material" means in the present context that the semiconductor body or at least a part thereof, particularly preferably at least the active region, comprises or consists of a nitride compound semiconductor material, preferably $Al_nGa_mIn_{1-n-m}N$, where $0 \leq n \leq 1$, $0 \leq m \leq 1$ and $n+m \leq 1$. In this context, this material need not necessarily have a mathematically exact composition according to the above formula. Rather, it may include, for example, one or more dopants as well as additional constituents. For the sake of simplicity, however, the above formula contains only the essential constituents of the crystal lattice (Al, Ga, In, N), even if these may be partially replaced and/or supplemented by small amounts of other substances.

The first region and the second region have different doping from each other. For example, the first region is p-doped and thus p-conductive, and the second region is then n-doped and thus n-conductive, or vice versa.

For example, the first and second regions are based on a nitride compound semiconductor material, in particular GaN.

The active region is formed between the two regions and comprises, for example, a pn-junction, a double heterostructure, a single quantum well (SQW) and/or a multiple quantum well (MQW) structure, in particular for radiation generation. The multiple quantum well structure comprises, for example, three or more barrier layers between which through layers are arranged.

According to at least one embodiment, the semiconductor chip comprises indentations in the first region of the semiconductor body. In particular, the indentations extend from the side of the first region facing away from the active region into the first region. In particular, it is possible that the indentations do not completely penetrate the first region and, for example, do not extend into the active region.

In the area of the indentations, the semiconductor body is free of the semiconductor material of the first region. The indentations are thus arranged, for example, in the manner of recesses or openings in the first region. The indentations may, for example, taper from the upper side of the first region facing away from the active region towards the active region, so that the indentations have their maximum diameter at the upper side of the first region facing away from the active region.

According to at least one embodiment of the semiconductor chip, the semiconductor chip comprises a TCO material in the indentations. A TCO material is a transparent conductive oxide. For example, the TCO material is zinc oxide, tin oxide, cadmium oxide, titanium oxide, indium oxide, and/or indium tin oxide (ITO).

The TCO material is arranged in the indentations. For example, at least one of the indentations, preferably a majority of the indentations, in particular all of the indentations, is/are at least locally or completely filled with the TCO material. For example, the TCO material fills at least 90% of the volume of at least one indentation, in particular of a majority of the indentations or all of the indentations.

According to at least one embodiment, the semiconductor chip comprises a carrier, wherein the indentations of the first region are arranged on the side of the first region facing away from the carrier. This means that the indentations filled with the TCO material are free of the carrier. In other words, the side of the first region facing away from the carrier is filled with the TCO material. The carrier is, for example, a growth substrate or an auxiliary carrier.

According to at least one embodiment, the second region of the semiconductor body is arranged on a carrier. In particular, the second region is in direct contact with the carrier. The first region is free of the carrier and not in direct contact with the carrier.

According to at least one embodiment, a semiconductor chip is specified, comprising
  a semiconductor body having a first region, a second region, and an active region between the first region and the second region,
  indentations in the first region,
  a TCO material in the indentations, and
  a carrier, wherein the indentations of the first region are arranged on the side of the first region facing away from the carrier.

Indentations in the first region of the semiconductor body can, for example, be filled epitaxially by applying semiconductor material. However, this requires special growth conditions which limit further optimization of the semiconductor body in the first region. For example, optimization of the electrical properties of the semiconductor body may thereby be limited, since contact resistances to subsequent, for example metallic, layers cannot be reduced or can only be reduced to a certain extent. Furthermore, also the roughness of the surface of the first region facing away from the active region cannot be arbitrarily reduced in this way. However, the roughness of this surface is a limiting factor for the reflectivity of a mirror, for example a metallic mirror, applied to the surface.

The present semiconductor chip is now based, inter alia, on the realization that filling the indentations with a TCO material allows the indentations to be closed in a simple manner. The TCO material limits further treatment of the surface where the TCO material is exposed and/or deposition of further layers on the surface to a lesser extent than, for example, an epitaxially formed semiconductor material in the indentations. Further, the use of a TCO material in the indentations has been found to improve contacting with subsequent electrically conductive layers, for example due to reduced contact resistance.

According to at least one embodiment of the semiconductor chip, the indentations are part of V-defects. In particular, it is possible that each of the indentations is part of a V-defect in the semiconductor body. The indentations are thus recesses in the semiconductor body, which may be formed in the shape of a pyramid or a truncated pyramid tapering towards the active region.

The pyramid or the truncated pyramid is formed here, for example, as a straight pyramid or straight truncated pyramid. The indentations have the shape of a V in a sectional view.

For example, the V-defects, and thus the indentations, have a hexagonal base and a lateral surface composed of six facets. The number of facets of each indentation may be a multiple of six. For example, it is possible for the indentations to have a lateral surface comprising, for example, twelve facets.

For example, the base of the indentations on the upper side of the first region facing away from the active region has a diameter of between 20 nm and woo nm inclusive. The depth of the indentations is preferably between 15 nm and 800 nm inclusive, more preferably between at least 100 nm and at most 400 nm.

The layers of the semiconductor body conform to the shape of the indentation, so that from the indentation this disturbance in the semiconductor body extends through the active region into the second region without the first region being completely penetrated by the indentation.

In other words, the TCO material in the indentation is directly adjacent to the first region in places, but not directly adjacent to the active region and/or the second region of the semiconductor body.

According to at least one embodiment of the semiconductor chip, the TCO material is flush with the surface of the first region facing away from the active region. This means that the TCO material does not protrude over the semiconductor material of the first region and vice versa, but the surface of the semiconductor chip formed on the side of the first region facing away from the active region, which surface comprises the outer surfaces of the TCO material, is formed smoothly within the manufacturing tolerance. As a result, subsequent layers, for example metallic layers, can be connected to the semiconductor body optically and electrically particularly well.

Preferably, the surface which comprises the surface of the first region facing away from the active region and the outer surface of the TCO material in the indentations has, in places or over the entire surface, a mean roughness value Rq of at most 2 nm, in particular less than or equal to 1 nm, preferably less than or equal to 0.5 nm. The mean roughness value Rq is the root mean square value of all profile values of the roughness profile. The term RMS is also used for the mean roughness value. Preferably, the mean roughness value is substantially smaller than 0.5 nm in places or over the entire surface, for example 0.2 nm or smaller.

According to at least one embodiment of the semiconductor chip, the semiconductor chip comprises a reflector which covers the indentations and the first region. The reflector thus also covers the TCO material in the indentations. The reflector is adjusted to reflect electromagnetic radiation generated in the active region during operation. The reflector may be in direct contact with the first region and the TCO material in places.

In the case that the TCO material is flush with the surface of the first region facing away from the active region and the semiconductor chip is thus formed particularly smoothly at the interface between the reflector and the semiconductor body, the reflectivity of the reflector for the incident radiation can be particularly high.

According to at least one embodiment of the semiconductor chip, the reflector comprises a metallic reflector region which is in direct contact with the TCO material and/or the first region. In particular, the metallic region is in direct contact with the first region and the TCO material. This enables a particularly high reflectivity. Furthermore, in this way, an electrical contact between the metallic region and the semiconductor body with the TCO material is particularly good. In particular, the contact resistance is particularly low.

For example, the metallic reflector region is formed by a mirror layer formed with a reflective material such as aluminum and/or silver. In particular, the metallic reflector region may consist of silver.

According to at least one embodiment of the semiconductor chip, the semiconductor chip comprises a further TCO material which covers the indentations and the first region. In this regard, the further TCO material may be in direct contact with the TCO material and the first region. For example, the further TCO material may comprise and consist of the same material as the TCO material. The semiconductor chip is then particularly easy to produce. Alternatively, it is possible that the further TCO material and the TCO material are different from each other. As a result, the optical and electrical properties of the semiconductor chip can be adjusted particularly well.

According to at least one embodiment of the semiconductor chip, the reflector comprises a dielectric reflector region which covers the further TCO material. The dielectric reflector region may be formed with, for example, an electrically insulating material. For example, the dielectric reflector region comprises a silicon nitride and/or a silicon oxide. For example, the dielectric reflector region may comprise a plurality of layers of, for example, two different insulating materials having a different refractive index from each other and stacked alternately. In this way, the dielectric reflector region may also form, for example, a Bragg reflector.

On the side of the dielectric reflector region facing away from the semiconductor body, the reflector can comprise a metallic reflector region, so that the reflector as a whole is formed as a combination of a dielectric reflector region with a metallic reflector. In this way, the reflector exhibits a particularly high reflectivity for the electromagnetic radiation generated in the active region.

According to at least one embodiment of the semiconductor chip, the reflector comprises a metallic reflector region which covers the dielectric reflector region and which is electrically conductively connected to the first region via through-connections.

The through-connections comprise, for example, recesses extending through the dielectric reflector region. The recesses are filled with an electrically conductive material, for example the material of the metallic reflector region. The further TCO material is arranged between the semiconductor body and the dielectric reflector region, or the dielectric reflector region is directly adjacent to the semiconductor body. The through-connections then contact either the further TCO material or the semiconductor body directly. For example, the metallic reflector region is in direct contact with the dielectric reflector region and the dielectric reflector region is in direct contact with, for example, the further TCO material or, in the absence thereof, the semiconductor body.

Further, a method for producing a semiconductor chip is specified. In particular, the method can be used to produce a semiconductor chip described herein. This means that all features disclosed for the semiconductor chip are also disclosed for the method, and vice versa.

According to at least one embodiment of the method, a semiconductor body having a first region, a second region, an active region between the first region and the second region, and indentations in the first region is first provided. The semiconductor body may be epitaxially grown, for example. The indentations may be part of V-defects and thus also be generated during the epitaxial process in a particularly simple manner.

According to at least one embodiment of the method, in a next method step, a TCO material is applied to the first region and into the indentations on the side of the first region facing away from the active region. In particular, the TCO material is selected to be thick enough to fill the indentations and to protrude over the upper side of the first region facing away from the active region. In this way, the TCO material is applied to the first region as a layer which can completely cover the side of the first region facing away from the active region.

According to at least one embodiment of the method, in the next method step, the TCO material is thinned from the side of the TCO material facing away from the first region by material removal.

According to at least one embodiment of the method for producing a semiconductor chip, the method comprises the following steps:

Providing a semiconductor body having a first region, a second region, an active region between the first region and the second region, and indentations in the first region, applying a TCO material to the first region and into the indentations on the side of the first region facing away from the active region, thinning the TCO material from the side of the TCO material facing away from the first region by material removal.

In this regard, it is possible that the TCO material is removed up to a certain thickness so that part of the TCO material remains on the upper side of the first region facing away from the active region and covers it completely.

The material removal creates a particularly smooth layer on the side of the TCO material facing away from the active region. This layer, which is in direct contact with the first region, forms, for example, a further TCO material which is directly adjacent to the TCO material in the indentations and the first region.

According to at least one embodiment of the method, the thinning exposes the first region and the TCO material remains exclusively in the indentations. In this way, a particularly smooth surface can be produced on the side of the first region facing away from the active region.

According to at least one embodiment of the method, the material removal comprises chemical-mechanical polishing. Chemical-mechanical polishing is particularly well suited to remove both TCO material and material of the semiconductor body. Furthermore, the chemical-mechanical polishing leads to a particularly smooth surface with the improved electrical and optical properties described herein.

According to at least one embodiment of the method, the material removal removes a portion of the first region. This means that a particularly smooth surface is produced during the material removal, since not only the TCO material is smoothed by the removal, but also material of the first semiconductor region. In this way, it is possible in particular for the TCO material in the indentations to be flush with the surface of the first region facing away from the active region.

Both the TCO material in the indentations and the first region of the semiconductor body thus exhibit traces of material removal, in particular traces of chemical-mechanical polishing, on the side facing away from the active region, which can be detected, for example, by analytical methods of semiconductor technology such as electron beam microscopy. Preferably, the surface which is smoothed by the chemical-mechanical polishing has in places or over the entire surface a mean roughness value Rq of at most 2 nm, in particular less than or equal to 1 nm, preferably less than or equal to 0.5 nm. Preferably, the mean roughness value is substantially smaller than 0.5 nm in places or over the entire surface, for example 0.2 nm or smaller.

BRIEF DESCRIPTION OF THE DRAWINGS

In the following, the method described herein and the semiconductor chip described herein will be explained in more detail with reference to exemplary embodiments and the accompanying figures.

FIGS. 10A, 1B, 1C, 1D show method steps of an exemplary embodiment of a method described herein for producing a semiconductor chip by means of schematic sectional views;

FIG. 1D shows an exemplary embodiment of a semiconductor chip described herein by means of a schematic sectional view.

Figure 1A:
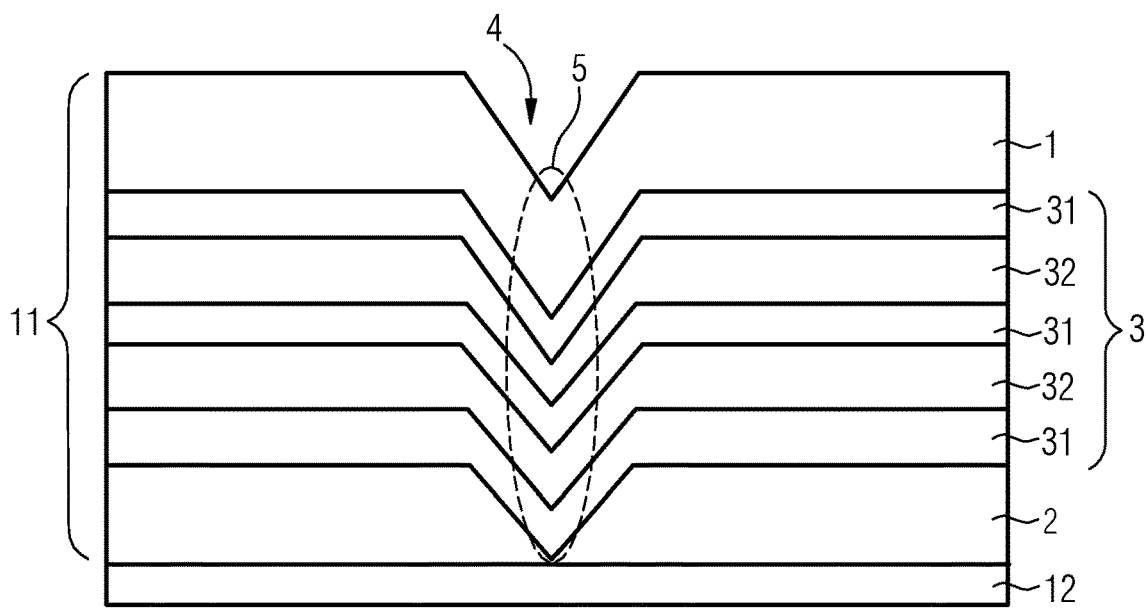

Elements that are identical, similar or have the same effect are given the same reference signs in the figures. The figures and the proportions of the elements shown in the figures are not to be regarded as true to scale. Rather, individual elements may be shown exaggeratedly large for better representability and/or for better comprehensibility.

DETAILED DESCRIPTION OF ILLUSTRATIVE EMBODIMENTS

In the method step of an exemplary embodiment of a method described herein for producing a semiconductor chip described in connection with FIG. IA, a semiconductor body 11 is first provided. The semiconductor body 11 is epitaxially grown or deposited on a carrier 12, for example. The carrier 12 may be, for example, an auxiliary carrier or a growth substrate, for example made of sapphire.

The semiconductor body 11 comprises a first region 1, a second region 2, an active region 3 between the first region and the second region, and indentations 4 in the first region 1. In the present embodiment, the first region is p-doped GaN. The second region 2 is n-doped GaN. In the present embodiment, the active region 3 comprises a multiple quantum well structure having barrier layers 31 and through layers 32 arranged alternately on top of each other. A V-defect 5 is formed in the semiconductor body 11. The indentation 4 is part of the V-defect 5. The semiconductor body 11 comprises a plurality of V-defects 5. For example, the V-defects 5 are formed in the area of dislocation lines in the semiconductor body.

Figure 1B:
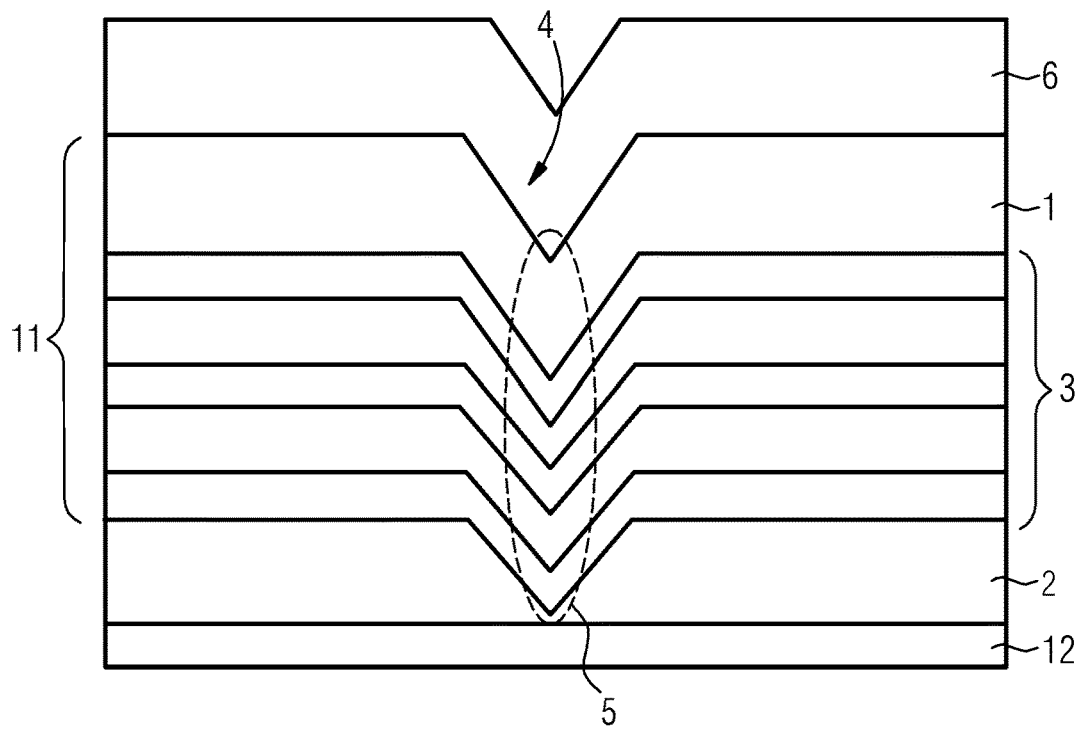

In the method step described in connection with FIG. 1B, a TCO material 6 is applied to the first region 1 and into the indentations 4 on the side of the first region 1 facing away from the active region 3. The TCO material 6 completely fills the indentations 4 and completely covers the first region 1 on its side facing away from the active region 3. The TCO material 6 may be deposited on the semiconductor body 11, for example, by vapor deposition or sputtering.

In the method step described in connection with FIG. 1C, the TCO material 6 is thinned from the side of the TCO material 6 facing away from the first region 1 by material removal 13. The material removal 13 comprises, for example, a chemical-mechanical polishing. In the present exemplary embodiment, the material removal 13 also partially removes the first region 1. In this way, a particularly smooth surface 1a is produced.

Figure 1C:
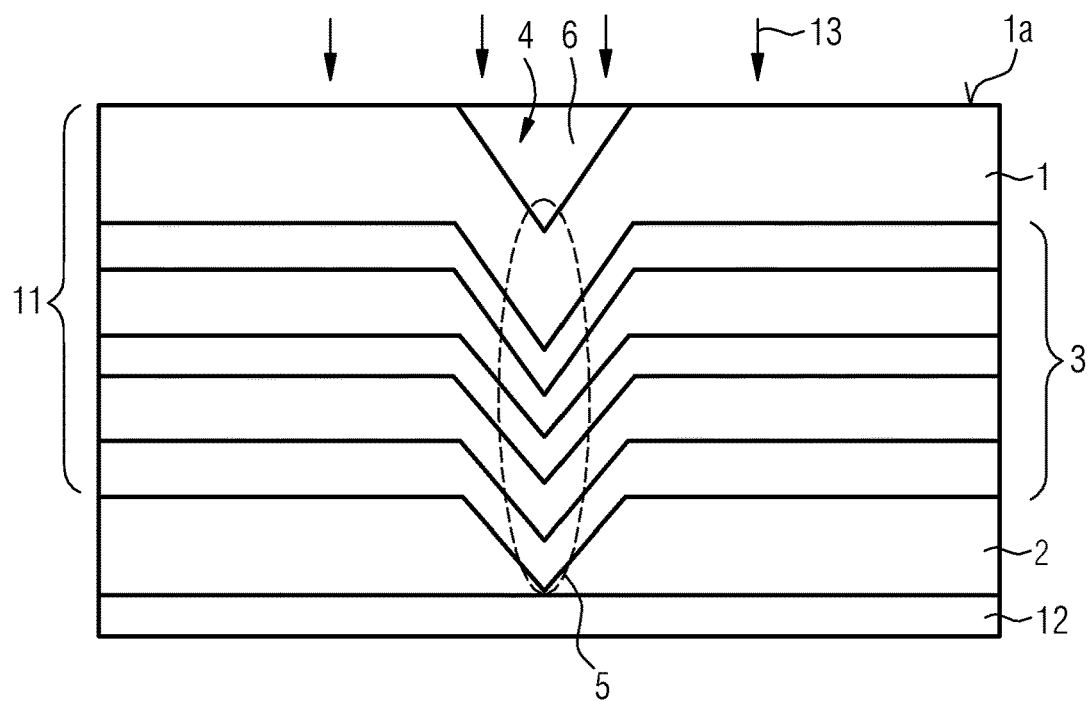
Figure 1D:
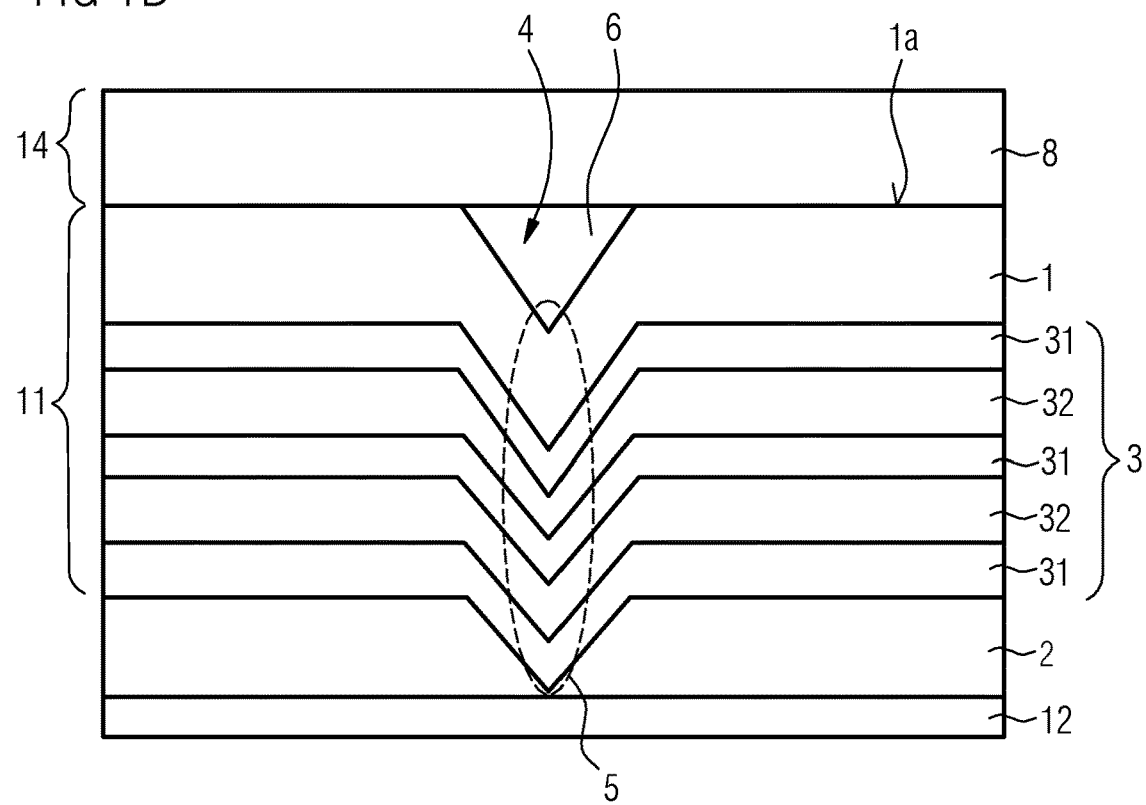

In the next method step, FIG. 1D, a reflector 14 is applied to the surface 1a. The reflector 14 comprises or consists of the metallic reflector region 8, which is made of silver, for example.

Material removal 13, and thus planarization in the semiconductor chip, results in the following advantages, among others:

Since the first region 1 is smoothed after growth by the material removal 13, there is freedom with respect to the deposition of the first region. For example, it is not necessary to pay attention to a particularly smooth growth during the deposition, since part of the first region 1 is removed anyway.

The surface 1a becomes particularly smooth as a result of the material removal 13, and has such a low roughness that it cannot be produced by growth alone.

Further, a portion of the first region 1 comprising in particular highly doped α-GaN is removed by the material removal 13. This removes layers that are relatively absorbent to the radiation generated in the active region 3. This means that the thinning of the first region also has a positive effect on the efficiency of the semiconductor chip, since an absorption of electromagnetic radiation in the first region 1 is reduced.

In connection with FIG. 1D, therefore, an exemplary embodiment of a semiconductor chip described herein is described. The semiconductor chip comprises a semiconductor body 11 having the first region 1, the second region 2, and the active region 3 between the first region and the second region. In the first region 1, indentations 4 are arranged which are filled with the TCO material 6. The indentations 4 are part of V-defects 5. The TCO material 6 in the indentations 4 is flush with the surface 1a of the first region 1 facing away from the active region 3. The reflector 14 covers the indentations 4 and the first region 1. The reflector 14 comprises a metallic reflector region 8, which is in direct contact with the TCO material 6 and the first region 1.

Figure 2:
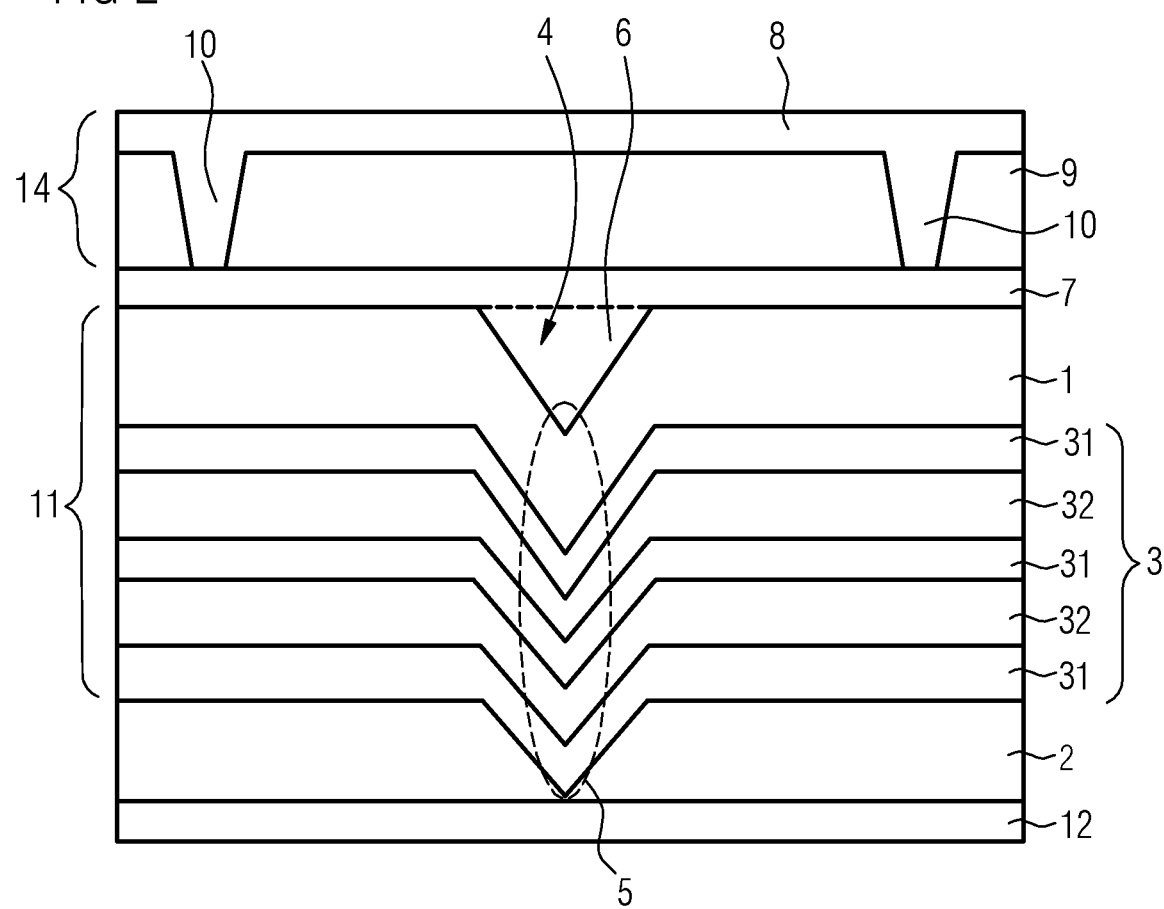
FIG. 2 shows a further exemplary embodiment of a semiconductor chip described herein by means of a schematic sectional view.

In connection with FIG. 2, a further exemplary embodiment of a method described herein is explained in more detail.

In contrast to the exemplary embodiment of FIG. 1, in the exemplary embodiment of FIG. 2 a further TCO material 7 is present which covers the indentations 4 and the first region 1.

In particular, the further TCO material 7 may be applied to the semiconductor body 11 after the material removal 13 described in connection with FIG. 1C. In this case, the further TCO material 7 may be applied to the particularly smooth surface 1a, which improves the optical and electrical properties of the semiconductor chip.

Alternatively, it is possible that in the method step of FIG. 1C the TCO material 6 is not completely thinned down to the first region 1 and remains as further TCO material 7. This has the advantage that the semiconductor chip can be produced with less time. A disadvantage results from the fact that the absorbing first region 1 is formed thicker, and the upper surface of the first region 1 facing away from the active region 3 is relatively rough.

In the exemplary embodiment of FIG. 2, the further TCO material 7 is followed by the reflector 14 comprising a dielectric reflector region 9, which may for example form a DBR (Distributed Bragg Reflector) mirror.

The reflector 14 further comprises a metallic reflector region 8, which covers the dielectric reflector region 9 and which is electrically conductively connected to the first region 1 via through-connections 10. For example, the through-connections 10 are formed with the material of the metallic reflector region, for example silver, and are formed in recesses of the dielectric reflector region 9. They establish an electrical contact with the further TCO material 7.

The invention is not limited to the exemplary embodiments by the description based thereon. Rather, the invention encompasses any new feature as well as any combination of features, which in particular includes any combination of features in the patent claims, even if this feature or combination itself is not explicitly stated in the patent claims or embodiments.

The invention claimed is:

1. A semiconductor chip comprising:
   a semiconductor body having a first region, a second region, and an active region between the first region and the second region;
   indentations in the first region;
   a TCO material in the indentations;
   a carrier; and
   a reflector covering the indentations and the first region,
   wherein the indentations of the first region are arranged on a side of the first region facing away from the carrier, and
   wherein the TCO material is flush with a surface of the first region facing away from the active region.

2. The semiconductor chip according to claim 1, wherein the indentations are part of V-defects.

3. The semiconductor chip according to claim 1, wherein the first region and the second region have a different doping from each other.

4. The semiconductor chip according to claim 1, wherein the reflector comprises a metallic reflector region which is in direct contact with the TCO material and the first region.

5. The semiconductor chip according to claim 1, further comprising a further TCO material covering the indentations and the first region.

6. The semiconductor chip according to claim 5, wherein the further TCO material is directly adjacent to the TCO material and the first region.

7. The semiconductor chip according to claim 5, wherein the reflector comprises a dielectric reflector region covering the further TCO material.

8. The semiconductor chip according to claim 7, wherein the reflector comprises a metallic reflector region which covers the dielectric reflector region and which is electrically conductively connected to the first region via through-connections.

9. A method for producing a semiconductor chip, the method comprising:
providing a carrier;
providing a semiconductor body having a first region, a second region, an active region between the first region and the second region, and indentations in the first region, wherein the indentations of the first region are arranged on a side of the first region facing away from the carrier;
applying a TCO material to the first region and into the indentations on the side of the first region facing away from the active region; and
thinning the TCO material from the side of the TCO material facing away from the first region by material removal,
wherein thinning exposes the first region, and
wherein the TCO material remains exclusively in the indentations.

10. The method according to claim 9, wherein thinning comprises chemical-mechanical polishing.

11. The method according to claim 9, wherein thinning comprises removing a portion of the first region.

12. A method for producing a semiconductor chip, the method comprising:
providing a carrier;
providing a semiconductor body having a first region, a second region, an active region between the first region and the second region, and indentations in the first region, wherein the indentations of the first region are arranged on a side of the first region facing away from the carrier;
applying a TCO material to the first region and into the indentations on the side of the first region facing away from the active region; and
thinning the TCO material from the side of the TCO material facing away from the first region by material removal,
wherein thinning comprises removing a portion of the first region.

13. The method according to claim 12, wherein thinning comprises chemical-mechanical polishing.

* * * * *